(12) United States Patent
Mahecic et al.

(10) Patent No.: US 12,000,999 B2
(45) Date of Patent: Jun. 4, 2024

(54) KOEHLER INTEGRATOR DEVICE AND APPLICATION THEREOF IN A MULTI-FOCAL CONFOCAL MICROSCOPE

(71) Applicant: ECOLE POLYTECHNIQUE FEDERALE DE LAUSANNE (EPFL), Lausanne (CH)

(72) Inventors: Dora Mahecic, Lausanne (CH); Kyle Douglass, Lausanne (CH); Suliana Manley, Lausanne (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 519 days.

(21) Appl. No.: 17/413,699

(22) PCT Filed: Dec. 17, 2018

(86) PCT No.: PCT/EP2018/085228
§ 371 (c)(1),
(2) Date: Jun. 14, 2021

(87) PCT Pub. No.: WO2020/125927
PCT Pub. Date: Jun. 25, 2020

(65) Prior Publication Data
US 2022/0026695 A1    Jan. 27, 2022

(51) Int. Cl.
*G02B 21/00*    (2006.01)
*G02B 27/09*    (2006.01)
*G02B 27/30*    (2006.01)

(52) U.S. Cl.
CPC ....... *G02B 21/0032* (2013.01); *G02B 21/008* (2013.01); *G02B 27/0927* (2013.01);
(Continued)

(58) Field of Classification Search
CPC .............. G02B 21/0032; G02B 21/008; G02B 27/0927; G02B 27/0961; G02B 27/0988;
(Continued)

(56) References Cited

U.S. PATENT DOCUMENTS 6,028,306 A    2/2000    Hayashi
2003/0223108 A1*    12/2003    Miyashita .............. G02B 21/12
359/368
(Continued)

FOREIGN PATENT DOCUMENTS

DE    10345432 A1    6/2005
DE    102008008580 A1    5/2009
(Continued)

OTHER PUBLICATIONS

Douglass et al. (2016). Super-resolution imaging of multiple cells by optimized flat-field epi-illumination. Nature photonics, 10(11), 705-708.
(Continued)

*Primary Examiner* — Arnel C Lavarias
(74) *Attorney, Agent, or Firm* — Caesar Rivise, PC (57) ABSTRACT

A Koehler integrator device includes a collimating lens for collimating a light field from an incoherent or partially coherent light source, planar first and second micro-lens arrays for relaying portions of the collimated light field along separate imaging channels, wherein all the micro-lenses have equal focal length and pitch and the arrays are arranged with a mutual distance equal to the focal length, and a collecting Fourier lens having a Fourier lens diameter and focal length defining front and back focal planes, wherein the Fourier lens is for superimposing light from all imaging channels in the front focal plane and wherein the second micro-lens array is in the back focal plane, wherein a third micro-lens array is in the front focal plane for
(Continued)

creating a wavelength independent array of illumination spots. Furthermore, a confocal microscope apparatus, including the device, and a method of using the apparatus are described.

24 Claims, 4 Drawing Sheets

(52) U.S. Cl.
CPC ..... *G02B 27/0961* (2013.01); *G02B 27/0988* (2013.01); *G02B 27/30* (2013.01)

(58) Field of Classification Search
CPC .... G02B 27/30; G02B 21/00; G02B 21/0004; G02B 21/002; G02B 21/0024; G02B 21/0036; G02B 21/0052; G02B 21/006; G02B 21/0076; G02B 21/06; G02B 21/08; G02B 21/18; G02B 21/36; G02B 21/361; G02B 3/0006; G02B 3/0062; G02B 3/0068; G02B 3/0075
USPC ....... 359/385, 362, 363, 368, 369, 372, 373, 359/389, 390, 434, 435, 618, 619, 621, 359/622, 626
See application file for complete search history.

(56) References Cited

U.S. PATENT DOCUMENTS

| | | |
|---|---|---|
| 2005/0110955 A1 | 5/2005 | Trollsch et al. |
| 2006/0072191 A1 | 4/2006 | Akiyama et al. |
| 2006/0078190 A1* | 4/2006 | Shibata ................ G06T 7/0004 382/149 |
| 2010/0271704 A1 | 10/2010 | Paetzel et al. |

FOREIGN PATENT DOCUMENTS

| | | | |
|---|---|---|---|
| EP | 2196839 A1 | 6/2010 | |
| JP | 2012078784 A * | 4/2012 | ......... G02B 27/0994 |

OTHER PUBLICATIONS

Schreiber et al. (2005). Homogeneous LED-illumination using microlens arrays. Nonimaging Optics and Efficient Illumination Systems II (vol. 5942, p. 59420K). International Society for Optics and Photonics, 1-9.

Tanaami et al. (2002). High-speed 1-frame/ms scanning confocal microscope with a microlens and Nipkow disks. Applied Optics, 41(22), 4704-4708.

Voelkel et al. (1996). Microlens array imaging system for photolithography. Optical Engineering, 35(11), 3323-3330.

Voelkel et al. (2008). Laser beam homogenizing: limitations and constraints. Optical Fabrication, Testing, and Metrology III (vol. 7102, p. 71020J). International Society for Optics and Photonics, 1-12.

York et al. (2012). Resolution doubling in live, multicellular organisms via multifocal structured illumination microscopy. Nature methods, 9(7), 749-754.

York et al. (2013). Instant super-resolution imaging in live cells and embryos via analog image processing. Nature methods, 10(11), 1122-1126.

Zimmermann et al. (2007). Microlens laser beam homogenizer: from theory to application. Laser Beam Shaping VIII (vol. 6663, p. 666302). International Society for Optics and Photonics, 666302-1-666302-13.

International Search Report from corresponding PCT/EP2018/085228 mailed Sep. 10, 2019.

* cited by examiner

KOEHLER INTEGRATOR DEVICE AND APPLICATION THEREOF IN A MULTI-FOCAL CONFOCAL MICROSCOPE

CROSS-REFERENCE TO RELATED APPLICATIONS

This application is a U.S. National Phase Application of PCT/EP2018/085228, filed Dec. 17, 2018, the contents of which are incorporated herein by reference in their entireties for all purposes.

FIELD OF THE INVENTION

The invention relates to a Koehler integrator device being adapted for creating a uniform array of spots of light. Furthermore, the invention relates to a multi-focal confocal microscope including the Koehler integrator device. Furthermore, the invention relates to methods of using the Koehler integrator device and the multi-focal confocal microscope. Applications of the invention are available e.g. in multi-focal confocal microscopy, lithography or other structured illumination tasks.

PRIOR ART

In the present specification, reference is made to the following prior art illustrating the technical background of the invention:

[1] T. Tanaami et al. in "Applied Optics" vol. 41, No. 22, 2002, p. 4704-4708;
[2] A. G. York et al. in "Nature Methods" vol. 9, No. 7, 2012, p. 749;
[3] A. G. York et al. in "Nature Methods" vol. 10, No. 11, 2013, p. 1123;
[4] EP 2 196 839 A1;
[5] R. Voelkel et al. in "Opt. Eng." vol. 35(11), November 1996, p. 3323;
[6] P. Schreiber et al. in "Nonimaging Optics and Efficient Illumination Systems II" Proceedings vol. 5942, 59420K (2005) (doi.org/10.1117/12.618747);
[7] K. M. Douglass et al. in "Nature Photonics" vol. 10, November 2016, p. 705 (DOI: 10.1038/N PHOTON.2016.200);
[8] M. Zimmermann et al. in "Proc. SPIE" vol. 6663 "Laser Beam Shaping VIII" 666302 (Sep. 26, 2007); doi: 10.1117/12.731391, 2007; and
[9] R. Voelkel et al. in "SPIE Europe Optical Systems Design" (2-5 Sep. 2008, Glasgow, Scotland, UK).

It is generally known that confocal microscopy has several advantages over widefield light microscopy, such as resolution and optical sectioning, making it a popular tool in bioimaging. The basic principle of operation includes focusing the excitation light to a diffraction limited spot, passing the emitted fluorescence through a pinhole placed in a conjugate image plane and imaging it onto a point detector. The pinhole serves to reject out of focus light and can result in an improvement in resolution. By scanning the excitation point across the sample, a larger image of the sample is constructed point by point.

This process has been parallelized to speed up image acquisition, by simultaneously scanning multiple diffraction limited excitation spots forming an array of excitation spots across the sample. Each of the excitation spots is imaged onto the sample, and the sample emission is focused onto matching pinholes in a conjugate image plane, before it is imaged onto an array detector, such as a camera chip. This technique is called multi-focal confocal microscopy, wherein most notable examples are the spinning disk confocal microscope ([1]) and the multi-focal or instant structured illumination microscopes ([2], [3]). The array of excitation spots is usually created by focusing light with a micro-lens array so that its focal plane is in a conjugate image plane ([3]). Alternatively, putting a pinhole array in the conjugate image plane will also produce an array of excitation spots, although with significant power loss since light will not be efficiently transmitted though the pinhole array. Occasionally, a combination of the excitation micro-lens array and the pinhole array is used to improve pinhole transmission efficiency ([1]).

In order to achieve uniform quality in the final image, it is crucial to provide an array of excitation points of equal intensity. Conventionally, a collimated laser beam incident on the excitation micro-lens array is used to generate the array of excitation points. However, a single mode laser beam intensity such as that used in confocal microscopy has, to a high degree of accuracy, a Gaussian intensity profile and will cause the relative intensities of the excitation spots to also follow a Gaussian distribution. For this reason, usually only the central part of the Gaussian beam is used, which causes significant power loss and still leaves significant intensity variation across the field of view. Similarly, other light sources usually also have non-uniform intensity profile, and hence face the same problem.

Previous attempts to solve this problem involve imaging the distal output end of a multimode fiber onto the excitation micro-lens array ([4]). Since the illumination profile at the fiber output is relatively flat, this will produce a uniform array of excitation spots in the conjugate image plane containing a pinhole array and located at the focal plane of the excitation micro-lens array. However, this technique suffers from a significant power loss stemming from either light coupling into the fiber or etendue conservation preventing light from being focused to a small spot. Similarly, extending the application to other illumination sources is likely to cause more power loss, at the point of coupling to the fiber.

Figure 6:
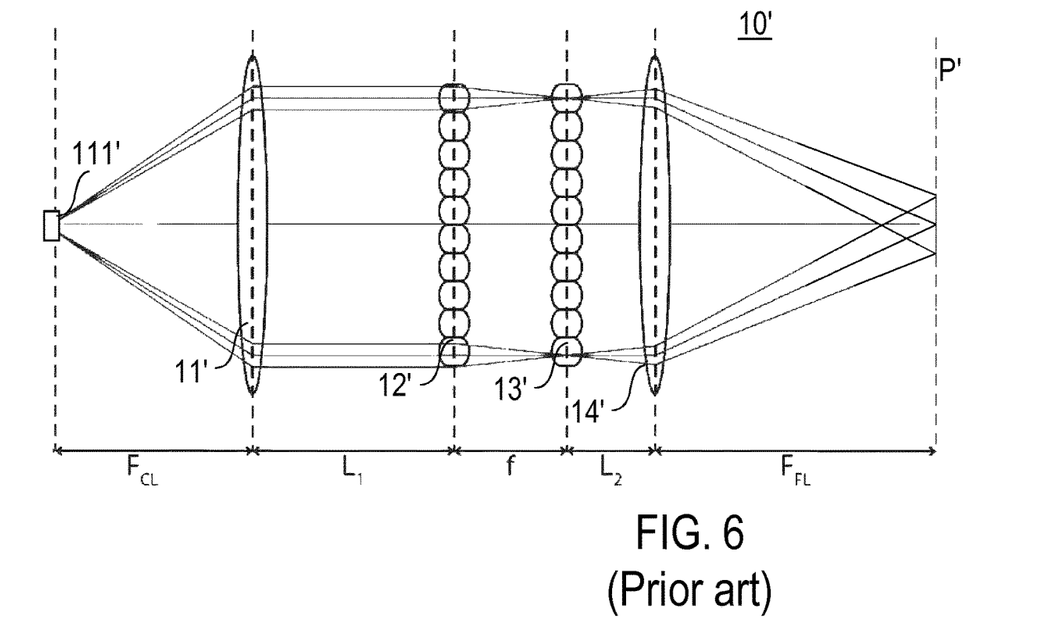
FIG. 6: a conventional Koehler integrator (prior art).

A popular tool for beam homogenization is the Koehler integrator, which has been previously applied to widefield illumination systems ([5], [6], [7]). The conventional Koehler integrator 10' as schematically shown in FIG. 6 is made up of a collimating lens 11', two micro-lens arrays 12', 13' displaced by their focal length and a Fourier lens 14'. The Koehler integrator allows for both the spatial distribution and angular distribution of a light source 111' to be integrated over the homogenization plane P', resulting in a flat-top intensity profile at the homogenization plane P'.

With more details, the source 111', characterized by a radius $R_{source}$ and an angular distribution $\theta_{source}$, is imaged by the collimating lens 11' of focal length $F_{CL}$ and first micro-lens array 12', characterized by the focal length $f$ and pitch p. The image of the light source 111' is formed at each micro-lens (lenslet) of the second micro-lens array 13', with identical focal length $f$ and pitch p. The first micro-lens array 12' effectively splits the angular distribution of the light source 111' into multiple beamlets corresponding the individual micro-lens channels. The second micro-lens array 13' and the Fourier lens 14', characterized by a focal length $F_{FL}$, combine the channels of the first micro-lens array 12' to generate a flat-top intensity profile at the homogenization plane P', located in the focal plane of the Fourier lens 14'. Effectively, this results in each single point and each emission angle of the light source 111' being mapped across the entire homogenization plane P'. The conventional Koehler integrator 10' has been adapted to different light sources, such as LEDs or lasers ([6], [8], [9]). In case of laser illumination, a focusing lens and a rotating diffuser are used to create the extended partially coherent source ([8], [9]).

While the conventional Koehler integrator can be used as a spot generator, the periodicity and therefore the pitch of the spots depends on the wavelength of light ([8], [9]). Thus, as this feature cannot be used to reliably generate a uniform array of excitation spots at multiple wavelengths, the conventional Koehler integrator has a limited range of applications. In particular, it is not adapted for multi-focal sample illumination in a multi-focal confocal microscope.

Objective of the Invention

The objective of the invention is to provide an improved Koehler integrator being capable of avoiding limitations of conventional techniques. In particular, the Koehler integrator is to be capable of having an extended range of applications, generating a uniform array of excitation spots at multiple wavelengths and/or achieving good power efficiency. According to a particular objective, the Koehler integrator is to be adapted for multi-focal sample excitation in a multi-focal confocal microscope. Furthermore, the objective of the invention is to provide an improved multi-focal confocal microscope being capable of avoiding limitations of conventional techniques. The multi-focal confocal microscope is to be capable of using a Koehler integrator for a wavelength-independent multi-focal sample illumination. Further objectives of the invention are to provide improved methods of using a Koehler integrator and a multi-focal confocal microscope, while avoiding limitations of conventional techniques.

BRIEF SUMMARY OF THE INVENTION

These objectives are correspondingly solved by a Koehler integrator, a multi-focal confocal microscope and methods of using them, comprising the features of the independent claims, respectively. Preferred embodiments and applications of the invention arise from the dependent claims.

According to a first general aspect of the invention, the above objective is solved by a Koehler integrator device that comprises a collimating lens, a pair of planar first and second micro-lens arrays (flat-fielding micro-lens arrays) and a Fourier lens, which are arranged along an optical axis of the Koehler integrator device. The collimating lens is adapted for collimating a light field created by a light source device. Typically, the light source device includes a light source having a certain size (extended light source). Preferably, the light source is an incoherent or partially coherent light source. The light field is collimated by the collimating lens along the optical axis. Each of the first and second micro-lens arrays comprises a regular grid arrangement of a plurality of micro-lenses with uniform spacing. Both micro-lens arrays extend perpendicular to the optical axis, and they have equal optical properties, in particular all micro-lenses have an equal micro-lens focal length and pitch (centre-to-centre-distance of neighboring micro-lenses). The micro-lens arrays are arranged with a mutual distance along the optical axis, wherein the distance is equal to the common micro-lens focal length. Each micro-lens of the first micro-lens array has a common micro-lens axis with a related micro-lens of the second micro-lens array (mutual alignment of the micro-lens arrays). The first and second micro-lens arrays are arranged for relaying portions of the collimated light field along separate micro-lens array channels (imaging channels), each being provided by one pair of mutually aligned micro-lenses of the first and second micro-lens arrays. The Fourier lens is a collecting lens having a Fourier lens diameter and a Fourier lens focal length defining a Fourier lens front focal plane and a Fourier lens back focal plane. The second micro-lens array is arranged in the Fourier lens back focal plane. Furthermore, the Fourier lens is arranged for superimposing light from all imaging channels in the Fourier lens front focal plane.

According to the invention, the Koehler integrator device comprises a planar third micro-lens array (excitation micro-lens array), which is arranged in the Fourier lens front focal plane for creating a wavelength independent array (e.g. regular grid or another arrangement) of light spots at its front focal plane (excitation micro-lens array front focal plane). The light spots are indicated in the following as illumination spots or excitations spots. The third micro-lens array is at the Fourier lens front focal plane, thus assuring telecentric illumination of the third micro-lens array. The light spots, e.g. as excitations spots in confocal microscopy, are formed in the excitation micro-lens array front focal plane. With the preferred application of the Koehler integrator device, the excitation micro-lens array front focal plane overlaps with a conjugate image plane in a multi-focal confocal system. Furthermore, the Fourier lens diameter preferably is equal to or larger than a diameter of the third micro-lens array, so that an illumination path is created that further supports the telecentric illumination of the third micro-lens array.

According to a second general aspect of the invention, the above objective is solved by a method of using the Koehler integrator device according to the above first general aspect of the invention for creating a pattern of excitation spots in a multi-focal confocal microscope. The multi-focal confocal microscope includes a light source device creating an excitation light field, which is relayed through the inventive Koehler integrator device for creating the array of excitation spots. Advantageously, employing the inventive Koehler integrator device provides a homogeneous structured illumination, thus reducing illumination artefacts in multi-focal confocal microscopy.

Providing the third micro-lens array is in contrast to conventional Koehler integrators, as described e.g. in [6], which is adapted for creating a homogeneous LED-illumination only, or in [7], which is adapted for wide-field microscopy. Furthermore, placing the second micro-lens array at the Fourier lens back focal plane provides a configuration for the telecentric illumination of the third micro-lens array, so that the array of illumination spots is created with a uniform pitch and positioning of the light spots being independent of the wavelength of light.

Advantageously, the inventive Koehler integrator device is configured for converting a non-uniform light profile to a uniform, wavelength-independent array of light spots with homogeneous intensities, which can be used as excitation spots in multi-focal confocal microscopes or with other applications, like lithography, illumination of fluorescence biochips or illumination of MEMS mirror array systems. Thus, new applications of the Koehler integrator device are provided. As an essential advantage, in particular for the application in a multi-focal confocal microscope, the Koehler integrator device is capable of overcoming three main challenges: generating an array of illumination spots of equal intensities, maintaining the structure (pitch and uniform spacing) of the multi-focal illumination and allowing the creation of diffraction-limited illumination spots at the sample plane.

As a further advantage of the invention, the array of illumination spots is created with high power efficiency as substantially all light created by a light source device is transmitted into the array of illumination spots. Furthermore, as another advantage of the invention, the Koehler integrator device has a compact design. Preferably, the bulk lenses of the Koehler integrator device, e.g. the collimating lens and the Fourier lens, comprise single lenses. However, in dependency on the application of the invention, the bulk lenses can be provided by multi-lens optics.

Another advantage of the invention is that the Koehler integrator device is applicable to a range of both coherent and incoherent light sources. Unlike refractive beam shaping elements, which have very strict constraints on the input beam size and shape in order to achieve a flat-top intensity profile, the Koehler integrator device is largely independent of the profile of the input beam. For example inputting an already flat-profile beam profile would not be allowed with other flat-fielding refractive elements, like the PiShaper or TopShape from manufacturer Asphericon, while it would be advantageous for the Koehler integrator.

The third micro-lens array of the inventive Koehler integrator device is a planar array extending perpendicular to the optical axis. Advantageously, the arrangement and size of the micro-lenses of the third micro-lens array can be selected in dependency on the particular application thereof. The micro-lenses can provide a regular micro-lens grid or alternatively any micro-lens arrangement, including e.g. irregular arrays, straight or curved line arrays or arrays of micro-lens groups. All micro-lenses of the third micro-lens array have the same focal length. In particular, the number, size and/or pitch of the micro-lenses can be selected in dependency on application conditions, like magnification and scanning range in case of a multi-focal confocal microscope. Preferably, the third micro-lens array has a pitch in a range from 50 μm to 1500 μm. Furthermore, the third micro-lens array preferably comprises at least 5*5 micro-lenses, e.g. 50*50 micro-lenses or more.

According to an advantageous variant of the invention, the third micro-lens array can have a fixed (static) configuration. The fixed array is preferred in a multi-focal confocal microscope or in a lithography apparatus being provided with a completely separate scanning device or with most of the other illumination applications. With a preferred example, if a multi-focal confocal microscope includes a scanning device having 1D or 2D galvanometer scanning mirrors, the third micro-lens array is fixed.

Alternatively, the third micro-lens array can have a scannable configuration. In this case, the third micro-lens array is movable perpendicular to the optical axis. For example, the third micro-lens array can be included in a rotatable disc. Advantageously, the scannable third micro-lens array can fulfill additional tasks, like scanning the illumination spots. With a preferred example, if a multi-focal confocal microscope includes Nipkow disks, the third micro-lens array is used as part of the scanning device.

The quality of the light field homogenization (in particular the variation of light intensity) in the front Fourier lens focal plane depends on the number of micro-lens channels used in the first and second micro-lens arrays of the Koehler integrator device. A Koehler integrator device which uses more micro-lens array channels will result in a better averaging out in the homogenization plane.

Therefore, illuminating the whole first and second micro-lens arrays is traditionally preferred, but not necessary as outlined below. Similarly, to avoid crosstalk between the adjacent micro-lens channels, the size $R_{source}$ of the light source imaged onto the second micro-lens array should be smaller than the size of an individual micro-lens in the second micro-lens array (see also [8]). This no-crosstalk condition can be formulated as:

$$\frac{f}{F_{CL}} \cdot R_{source} \leq \frac{p}{2}$$

(with micro-lens focal length $f$, micro-lens pitch p, collimating lens focal length $F_{CL}$). Crosstalk would cause multiple, partially overlapping flat fields to appear in the homogenization plane and would decrease the quality of the flat field.

To assure the micro-lenses of the first and second micro-lens arrays act like refractive elements, and not pinholes, it is preferred to choose micro-lens arrays with relatively high Fresnel numbers FN (see also [8]), [9]):

$$FN = \frac{p^2}{4\lambda f}$$

where $\lambda$ is the wavelength of light. Usually, FN≳5 provides good homogeneity from the Koehler integrator device.

Assuming the above conditions are met, the size of the flat field S in the homogenization plane is set by the properties of the flat-fielding micro-lenses (focal length $f$, pitch p) and the Fourier lens focal length $F_{FL}$ (see also [8], [9]):

$$S = \frac{F_{FL} p}{f}$$

The pitch and focal length of the micro-lenses of the first and second micro-lens arrays is selected in dependency on the Fresnel number of the Koehler integrator device to be obtained and fulfilling the no-crosstalk condition. Thus, according to preferred variants of the invention, the pitch of each of the first and second micro-lens arrays is selected in a range from 50 μm to 1500 μm, and a focal length in the range of 1 mm to 500 mm.

Furthermore, the number of the micro-lenses of the first and second micro-lens array is selected in dependency on the homogeneity of the light field to be obtained. According to further preferred variants of the invention, each of the first and second micro-lens arrays comprises at least 5*5 micro-lenses, in particular at least 20*20 micro-lenses. The number of illuminated micro-lenses is selected not only for setting the homogeneity of excitation spots, but also the size of excitation spots.

According to a further advantageous embodiment of the invention, the Koehler integrator device comprises a beam sizing optic being arranged between the collimating lens and the first micro-lens array for changing, in particular contracting (beam de-expander optic) or expanding (beam expander optic) a diameter of the collimated light field.

Advantageously, the beam sizing optic contracting the diameter of the collimated light field provides an improved focus of the light source into diffraction-limited spots in the front focal plane of the third micro-lens array. With the multi-focal confocal microscope application of the invention, the front focal plane of the third micro-lens array even is focused into the image plane conjugate to the sample plane. Thus, the resolution of the multi-focal confocal microscope can be improved depending on the size of the excitation spots on the sample. Contrary to the conventional Koehler integrator, where illuminating a maximal number of flat-fielding micro-lenses is preferred, illuminating fewer micro-lenses allows to manipulate the incident illumination to balance homogeneity and size of excitation spots. With the beam sizing, it is possible tune the apparent size and angular distribution of the light source effectively limiting the number of micro-lens channels of the first and second micro-lens arrays, in order to achieve diffraction-limited excitation at the sample, efficient light transmission and homogeneity across the array of excitation spots. With the alternative case of a beam sizing optic expanding the diameter of the collimated light field, advantages are obtained if imaging a narrow angular distribution of a large light source is required.

Various implementations of the beam sizing optic are available. If the beam sizing optic for beam contraction comprises a first beam de-expander lens having a first beam de-expander lens focal length and a second beam de-expander lens having a second beam de-expander lens focal length, which is smaller than the first beam de-expander lens focal length, advantages in terms of a compact beam sizing optic are obtained. Accordingly, with the beam sizing optic for beam expansion, a first beam expander lens having a first beam expander lens focal length and a second beam expander lens having a second beam expander lens focal length are provided, which is larger than the first beam expander lens focal length.

Alternatively, the beam sizing optic can comprise a variable beam expander, in particular a variable zoom Galilean beam imaging optic. Advantageously, this facilitates the adjustment of the beam sizing and an adaptation to different illumination requirements, especially without the need to change the lenses and their positions. In particular, the beam sizing optic is adjustable for controlling the diameter of the collimated light field.

Alternatively or additionally, the radius of the light field can be reduced by arranging a hard aperture between the collimating lens and the first micro-lens array. The hard aperture has an advantage in terms of the simple structure thereof. Preferably, the hard aperture comprises an iris diaphragm, in particular with a fixed or variable diameter.

According to a further preferred embodiment of the invention, a pinhole array is arranged in a front focal plane of the third micro-lens array for limiting the diameter of generated illumination spots. Due to the size of the excitation spots, the pinhole array is preferred for providing diffraction-limited excitation spots, e.g. for illuminating the sample in a multi-focal confocal microscope. The pinhole array comprises a planar opaque shield including an array of openings (pinholes, preferably circular). The pinholes preferably are arranged with the same pitch and uniform spacing like the micro-lenses of the third micro-lens array. Each pinhole of the pinhole array has a common pinhole axis with a related micro-lens of the third micro-lens array (mutual alignment of the third micro-lens array and pinhole array).

Providing the pinhole array has particular advantages for the multi-focal confocal microscope application of the Koehler integrator device. In order for a confocal microscope to achieve high resolution, the excitation spots should be focused down to the diffraction limited spots in the sample plane. This imposes a maximal spot size that should be generated in the conjugate image plane after the micro-lenses of the third micro-lens array, depending on the magnification of the system. However, with a conventional Koehler integrator the size of the spots in the conjugate image plane will be large due to the extended light source. For achieving the diffraction limited spots at the sample, the pinhole array can be used to limit the size of the excitation spots. Preferably, the beam sizing optic for beam contraction is provided with this embodiment, so that advantages in terms of improving the transmission efficiency through the pinholes are obtained. Furthermore, despite of the fact that this causes loss in transmission efficiency, employing the pinhole array may be preferred in the case where the excitation spots are not sufficiently contracted with the beam sizing optic for beam contraction, in order to increase the resolution of the multi-focal confocal microscope.

According to a third general aspect of the invention, the above objective is solved by a confocal microscope apparatus, in particular a multi-focal confocal microscope, including the Koehler integrator device according to the above first general aspect of the invention. The multi-focal confocal microscope comprises a light source device for creating an excitation light field, the inventive Koehler integrator device for creating the array of excitation spots, a scanning device for creating a scanning pattern of the excitation spots, a focusing optic for focusing the scanning pattern of the excitation spots to a sample to be imaged, and an array detector device for detecting a pattern of emission spots excited by the pattern of illumination spots.

Advantageously, the multi-focal confocal microscope is capable of exciting the sample with a homogeneous array of excitation spots while preserving the geometric requirements of the multi-focal illumination and achieving good power efficiency. This is in contrast to conventional techniques, wherein the array of excitation points is generated simply by sending a collimated beam through an excitation micro-lens array. With the invention, the non-homogeneous profile of the incident beam as occurring in the conventional techniques is avoided, so that the resulting array of excitation points does not vary spatially in intensity.

The light source device of the multi-focal confocal microscope may comprise a coherent light source or an incoherent light source. In case of a coherent light source, preferably a focusing lens and a light scrambling device are arranged between the coherent light source and the collimating lens of the Koehler integrator device. The light scrambling device can comprise e.g. a rotating diffuser. However, coherent light can be scrambled by other devices as well, like e.g. mechanical shaking components (see [4]) or scattering media. Optionally, the focusing lens and the collimating lens provide an imaging optic including the light scrambling device. Advantageously, this allows to vary the size of the light source. Alternatively, this can be obtained by changing the position of the focusing lens and/or the rotating diffuser.

Using the incoherent light source can have advantages as it does not require a light scrambling device, like the rotating diffuser.

According to a further preferred embodiment of the invention, the confocal microscope apparatus comprises the pinhole array of the Koehler integrator device in the front focal plane of the third micro-lens array for limiting the diameter of generated illumination spots. Depending on the scanning mechanism used, the pinhole array can comprise a fixed or scannable pinhole array. The fixed pinhole array is used in case of a scanning device having a 1D or 2D galvanometer scanning mirror, while the scannable pinhole array is used in case of a scanning device having a Nipkow disk.

According to a fourth general aspect of the invention, the above objective is solved by a method of using a confocal microscope apparatus according the third general aspect of the invention for imaging a sample to be investigated.

If the Koehler integrator device of the multi-focal confocal microscope includes the beam sizing optic, the confocal imaging preferably includes controlling the diameter of the collimated excitation light field by adjusting the beam sizing optic such that both of the homogeneity of the illumination and the spot size of the illumination spots are sufficient for the imaging of the sample to be investigated. Alternatively, if the Koehler integrator device includes the iris diaphragm with a variable diameter, the confocal imaging preferably includes controlling the diameter of the collimated light field by changing the size of the iris diaphragm.

BRIEF DESCRIPTION OF THE DRAWINGS

Further details and advantages of the invention are described in the following with reference to the attached drawings, which schematically show in.

PREFERRED EMBODIMENTS OF THE INVENTION

Features of preferred embodiments of the invention are described in the following with reference to the configuration of the Koehler integrator device and the integration thereof in a multi-focal confocal microscope. It is emphasized that the implementation of the invention is not restricted to the details of the optical design, but rather possible with changed parameters, in particular with changed numbers and pitch of the micro-lenses, changed focal lengths of the optical components and/or changed overall diameter of the optical components. Furthermore, the implementation of the invention is not restricted to the use of the Koehler integrator device in a multi-focal confocal microscope, but correspondingly possible in a lithography apparatus or with other illumination tasks with fixed or dynamically changing multiple spots. Details of operating a multi-focal confocal microscope, in particular features of the scanned structured sample excitation, are not described as they are known per se from conventional multi-focal confocal microscopes.

Figure 1:
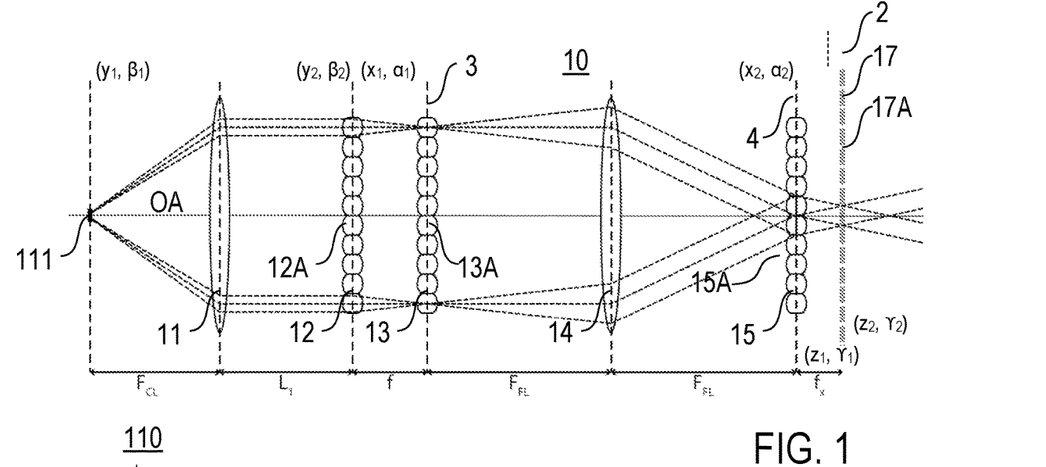
FIGS. 1 to 3: Koehler integrator devices according to embodiments of the present invention.

Embodiments of the Koehler Integrator Device and the Multi-Focal Confocal Microscope FIG. 1 shows a first embodiment of the inventive Koehler integrator device 10, including the collimating lens 11, the first and second micro-lens arrays 12, 13, the collecting Fourier lens 14, the third micro-lens array 15 and the optional pinhole array 17, being arranged along the optical axis OA. Additionally, the Koehler integrator device 10 includes a casing and mechanical components holding the optical components in place (not shown). The mechanical components, like lens frames or micro-lens array frames, can be adapted for adjusting the position of the optical components along the optical axis and/or for exchanging optical components. The Koehler integrator device 10 is configured for creating an array of illumination spots in an image plane 2, where the optionally provided pinhole array 17 is located.

Light from a light source 111 is collimated with the collimating lens 11 having a focal length $F_{CL}$ (e.g. 60 mm). The collimated light field is relayed to the first micro-lens array 12, having a distance $L_1$ (e.g. 50 mm) from the collimating lens 11. The first micro-lens array 12 comprises e.g. 33*33 micro-lenses 12A with a pitch p of e.g. 300 μm and a focal length $f$ (e.g. 5 mm). The second micro-lens array 13 has the identical properties like the first micro-lens array 12. Both micro-lens arrays 12, 13 have a mutual distance equal to the focal length $f$.

The Fourier lens 14 has a Fourier lens diameter (e.g. 500 mm) and a Fourier lens focal length $F_{FL}$ (e.g. 300 mm) defining a Fourier lens back focal plane 3 and a Fourier lens front focal plane 4. The second micro-lens array 13 is arranged in the Fourier lens back focal plane 3 and the third micro-lens array 15 is arranged in the Fourier lens front focal plane 4. The Fourier lens 14 superimposes light from all micro-lenses 13A of the second micro-lens array 13 in the third micro-lens array 15, which creates the array of illumination spots in the image plane 2.

The third micro-lens array 15 comprises a plurality of micro-lenses 15A having a common focal length $f_x$ (e.g. 2 mm). The pitch $p_x$ of the micro-lenses 15A is selected in dependency on the magnification to be obtained with the multi-focal confocal microscope and the scanning range, and the number of the micro-lenses 15A is selected in dependency on the pitch and the field of view size to be obtained. With the practical application in a multi-focal confocal microscope, the third micro-lens array 15 comprises e.g. 100*100 micro-lenses with a 222 μm pitch.

To preserve the pitch and uniform spacing of the excitation spots, telecentric illumination of the third micro-lens array is provided by placing the Fourier lens 14, so that it's back focal plane overlaps with the second micro-lens array 13, and preferably by using the third micro-lens array 15 with a diameter smaller than the diameter of the Fourier lens 14. This will ensure that the pitch of the array of excitation spots remains constant and corresponds to the pitch $p_x$ of the third micro-lens array 15. Furthermore, this way, the pitch of the multi-focal excitation will be independent of the wavelength of light, unlike the array spots generated by a conventional Koehler integrator [9]. Without telecentric illumination, the pitch of the array of excitation spots would not correspond to the pitch of the micro-lenses 15A, and they would will vary spatially. This would become a problem when scanning the array of excitation spots across the sample, and would produce an uneven illumination of the reconstructed image. In particular, the image plane 2 containing the array of excitation spots may be conjugate to another image plane of the multi-focal confocal microscope containing an array of pinholes to filter the emission light. In this case, a varying pitch would not be matched with the filtering array of pinholes, and as a result the emission will be occluded and decrease in intensity away from the center of the optical path.

The pinhole array 17 is arranged in the front focal plane of the third micro-lens array 15, i.e. with a distance equal to the focal length $f_x$ from the third micro-lens array 15. The pinhole array 17 comprises an opaque sheet, made of e.g. chrome on quartz with a thickness of e.g. 2 mm. A plurality of pinholes 17A are included in the sheet material, which are arranged like the micro-lenses 15A. Each of the pinholes 17A is aligned with the optical axis of one of the micro-lenses 15A. All pinholes 17 have the same diameter of e.g. 30 μm. In most applications of the Koehler integrator device 10, the front focal plane of the third micro-lens array 15, optionally with the pinhole array 17, represents the input plane of an apparatus including the Koehler integrator device 10, like the conjugate image plane of a multi-focal confocal microscope (see FIGS. 4 and 5).

The size of the excitation spots depends on the properties of the extended source as shown by a ray transfer matrix analysis (further details see below "Ray transfer matrix analysis"):

$$\begin{pmatrix} r_{n,m} \\ \theta_{n,m} \end{pmatrix} = \begin{pmatrix} \dfrac{f \cdot f_x}{F_{FL} F_{CL}} R_{source} + \dfrac{f_x}{F_{FL}} np \\ \left(\dfrac{f}{F_{FL} \cdot F_{CL}} + \dfrac{F_{FL}}{f \cdot f_x}\left(1 - \dfrac{L}{F_{CL}}\right)\right) R_{source} + \\ \dfrac{F_{CL} \cdot F_{FL}}{f \cdot f_x} \theta_{source} + \left(\dfrac{1}{F_{FL}} - \dfrac{F_{FL}}{f \cdot f_x}\right) np + \dfrac{mp_x}{f_x} \end{pmatrix}$$

wherein r is the size of the excitation spots, θ the angular distribution, n is the index of the first and second micro-lens arrays 12, 13 and m the index of the third micro-lens array 15 (assuming n=0 and m=0 correspond to the micro-lenses centred on the optical axis). From this, np=R defines the radius of the beam incident on the first micro-lens array 12. The radius of the excitation spots can be rewritten as the first term, taken for maximal values of the extended source radius and the size of the beam incident on the first micro-lens array 12:

$$r = \dfrac{f \cdot f_x}{F_{FL} \cdot F_{CL}} R_{source} + \dfrac{f_x}{F_{FL}} R$$

There are two contributions determining the size the excitation spots: the size of the extended source $R_{source}$ and the radius R of the beam incident on the first micro-lens array 12. However, since $f$ and $f_x$ are preferably on the order of a few millimetres, and $F_{FL}$ and $F_{CL}$ on the order of 10s to 100s of millimetres, the first term becomes negligible, while the second term will have a dominant effect on the size of the excitations spots.

Figure 2:
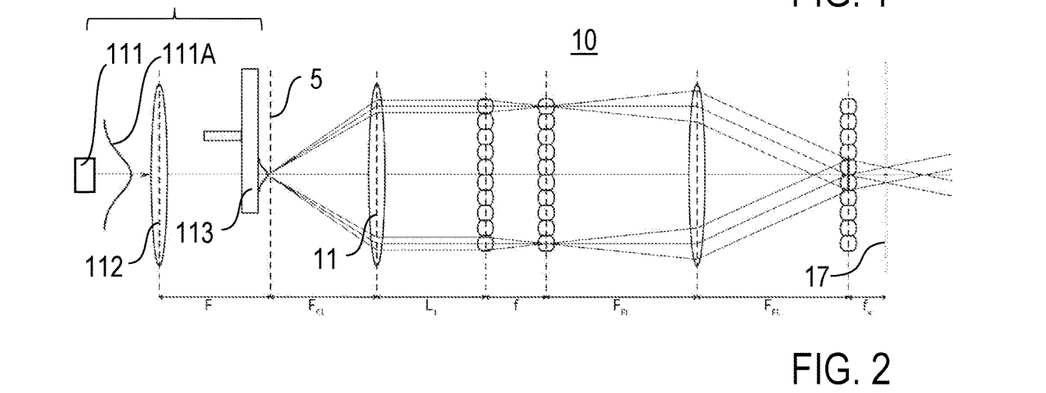

FIG. 2 shows the provision of a light source device 110 with the Koehler integrator device 10 of FIG. 1. This light source device 110 can be provided e.g. in a multi-focal confocal microscope (see FIGS. 4, 5). The light source device 110 comprises a coherent light source 111, like a laser (e.g. type 488 nm wavelength continuous wave (CW) with M^2<1.1, centre wavelength depending on the sample to be imaged), a focusing lens 112 and a rotating diffuser as a light scrambling device 113. The focusing lens 112 focusses the laser light field 111A through the light scrambling device 113 into the focal plane 5 of the collimating lens 11.

Figure 3:
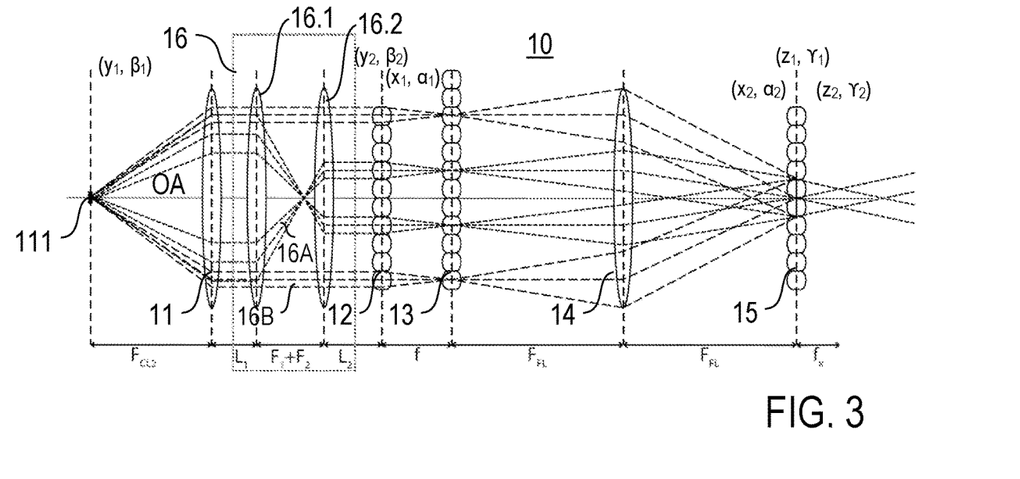

An alternative embodiment of the inventive Koehler integrator device 10 is shown in FIG. 3, wherein a beam sizing optic 16 is arranged between the collimating lens 11 and the first micro-lens array 12. Inserting the beam sizing optic 16 contracts the angular distribution of the extended light source 111. This in turn allows better focusing in the focal plane of the third micro-lens array 15. The inner rays 16A of the light field show the rays when the beam sizing optic 16 is in place, and the outer rays 16B show the rays without the beam de-expander 16. The beam sizing optic 16 comprises two lenses 16.1, 16.2 having focal lengths $F_1$ (e.g. 120 mm) and $F_2$ (e.g. 30 mm) with $F_2 < F_1$ and being arranged with a distance $F_1 + F_2$.

The beam sizing optic 16 shrinks the radius of the beam R to $R^* \cong (F_2/F_1)R$, without rejecting light. Introducing the beam sizing optic with the focal lengths $F_1$ and $F_2$ between the collimating lens 11 and the first micro-lens array 12, gives (further details see below "Ray transfer matrix analysis"):

$$r = \dfrac{f \cdot f_x \cdot F_1}{F_{FL} \cdot F_{CL} \cdot F_2} R_{source} + \dfrac{f_x}{F_{FL}} $$

$$R^* \cong \dfrac{f \cdot f_x \cdot F_1}{F_{FL} \cdot F_{CL} F_2} R_{source} + \dfrac{f_x \cdot F_2}{F_{FL} \cdot F_1} R$$

As the beam sizing optic contracts the size of the beam ($F_2 < F_1$), this results in a decrease in the diameter of the beam R by a factor of $F_2/F_1$. Although it also results in an inverse increase in the apparent size of the extended light source, since the second term carries a larger weight, the dominant effect is the decrease in the size of the excitation spots. With the provision of the beam de-expander 16, the pinhole array 17 to block excess light is therefore no longer required, improving the overall light transmission efficiency.

It should be noted that the quality of homogenization of the Koehler integrator device depends on the number of flat-fielding micro-lens channels over which the flat-field is averaged. Therefore, maximizing the number of micro-lens channels is usually preferred. Decreasing the radius of the beam incident on the first micro-lens array 12 with the beam sizing optic 16 may seem counterintuitive, as averaging over fewer micro-lens channels will reduce the homogeneity of the flat-field. Therefore, the beam sizing optic 16, in particular the focal lengths $F_1$ and $F_2$, preferably is configured for an optimization of the trade-off between homogeneity and spot size. For easier manipulation and optimization of this trade-off, it is preferred to use a variable beam de-expander to perform the light field contraction.

An alternative way to reduce the radius of the beam R is to put an iris (not shown) between the collimating lens and first micro-lens array 12. The iris would act as a mask and block light from passing through above a certain radius from the optical axis, effectively reducing the size of the beam incident on the first micro-lens array 12. This embodiment is preferred if power loss introduced by the iris is acceptable with the particular application of the inventive Koehler integrator device 10.

Figure 4:
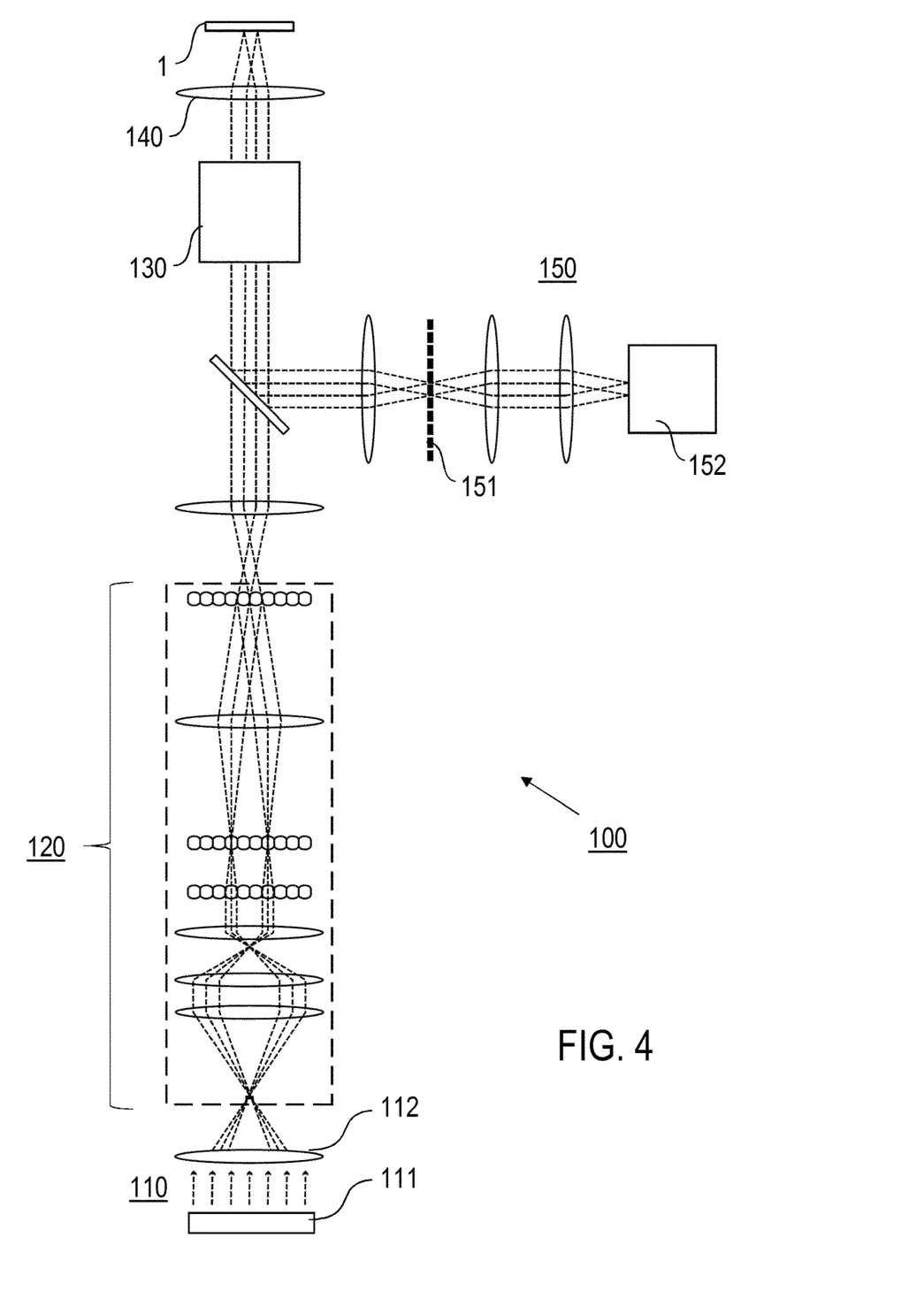
FIGS. 4 to 5: multi-focal confocal microscopes according to embodiments of the present invention.
Figure 5:
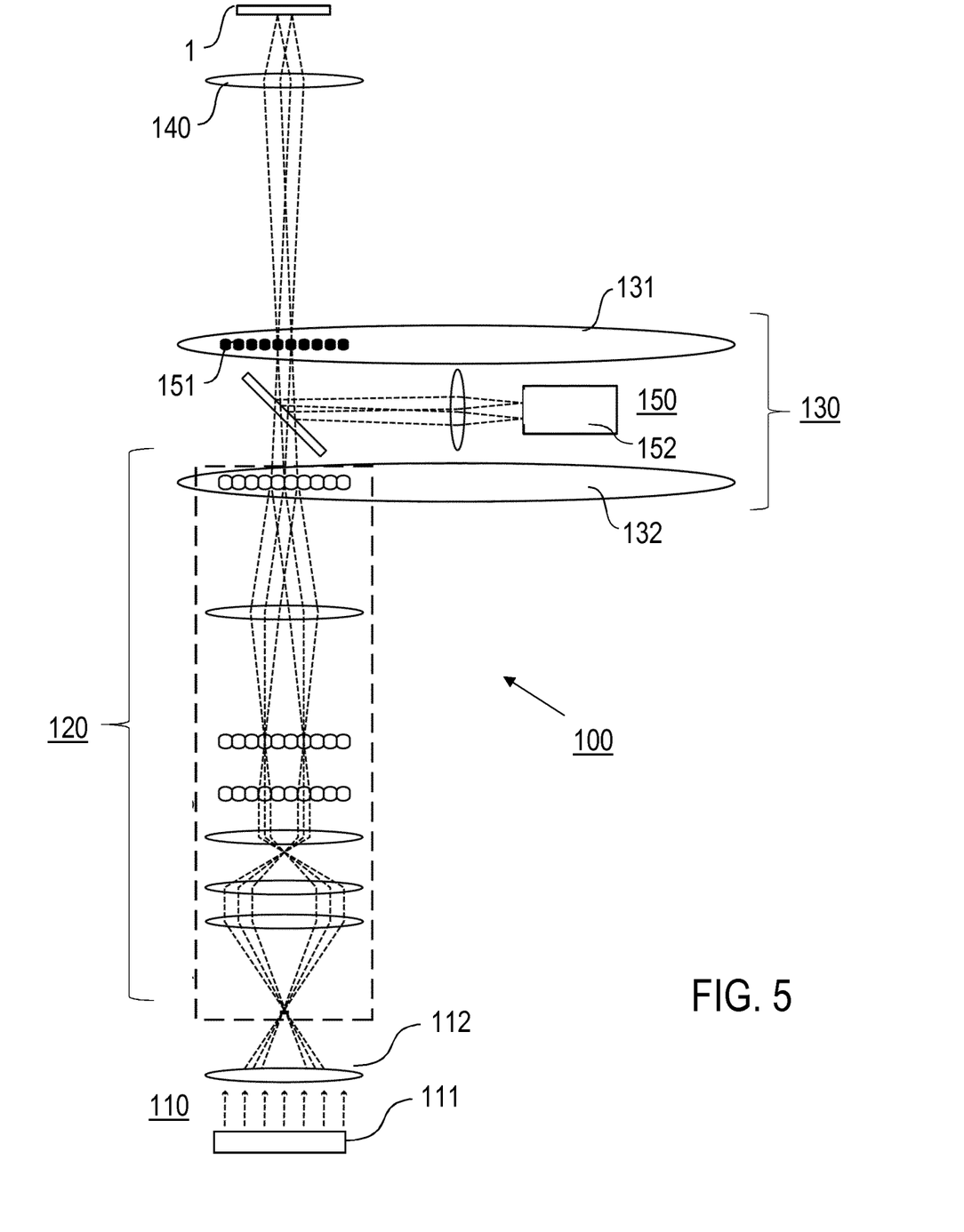

FIGS. 4 and 5 show exemplary embodiments of a multi-focal confocal microscope 100 including the inventive Koehler integrator device 120. Furthermore, the multi-focal confocal microscope 100 includes a light source device 110, a scanning device 130, a focusing optic 140 and a detector device 150 with a conjugate pinhole array 151 and an array detector camera 152. With the illustrated examples, light source device 110 comprises an incoherent light source 111, e.g. an LED, being focused with the focusing lens 112 into the Koehler integrator device 120. With the focusing optic 140, the array of excitation spots created with the Koehler integrator device 120 is imaged into the sample 1.

The scanning device 130 of FIG. 4 is any generic scanner, like e.g. galvanometer scanning mirror, creating a scanning pattern of excitation spots based on the spots array output by the Koehler integrator device 120. The scanning pattern is provided as known in multi-focal confocal microscopy. Alternatively, the scanning device 130 is provided by spinning discs 131, 132 upon which are mounted the third micro-lens array 15 and the pinhole array 151, resp., as shown in FIG. 5. The spinning discs 131, 132 have openings, which create the scanning pattern by disc rotation.

The inventive Koehler integrator device 10, e.g. as shown in FIGS. 1 to 3, is configured on the basis of the following design equations for its implementation in multi-focal confocal microscopes, e.g. according to FIGS. 4 and 5 (see also [8], [9]):

Fresnel Number:

$$FN = \frac{p^2}{4\lambda f}$$

For good homogeneity FN≳5
Flat field size:

$$S = \frac{F_{FL} p}{f}$$

Depends on size of the field of view and magnification
Flat field size (at sample):

$$S_{sample} = \frac{1}{M} \frac{F_{FL} p}{f}$$

Size of excitation spots (in focal plane of third micro-lens array 15):

$$r = \frac{f \cdot f_x \cdot F_1}{F_{FL} \cdot F_{CL} \cdot F_2} R_{source} + \frac{f_x \cdot F_2}{F_{FL} \cdot F_1} R$$

(Depends on magnification)
Size of excitation spots (at sample) should be diffraction limited:

$$r_{sample} = \frac{1}{M} \left( \frac{f \cdot f_x \cdot F_1}{F_{FL} \cdot F_{CL} \cdot F_2} R_{source} + \frac{f_x \cdot F_2}{F_{FL} \cdot F_1} R \right)$$

Flat Field Homogeneity:

$$B = \frac{R}{p}$$

For good homogeneity, B≳4
No-Crosstalk Condition:

$$\frac{F_1 \cdot f}{F_2 \cdot F_{CL}} \cdot R_{source} \leq \frac{p}{2}$$

The design equations are functions of the following design parameters $f$—focal length of flat-fielding micro-lens arrays 12, 13, p—pitch of micro-lens arrays 12, 13, $f_x$—focal length of third micro-lens array 15, $p_x$—third micro-lens array 15, $F_{FL}$—focal length of Fourier lens 14, $F_{CL}$— focal length of collimating lens 11, $F_1$— focal length of first beam expander lens 16.1, $F_2$— focal length of second beam expander lens 16.2, $R_{source}$—radius of extended light source 111, $R_{source}$—angular divergence of extended light source 111, M—magnification, R—beam radius incident on the first micro-lens array 12 without the beam expander 16 (can be estimated as: $R \cong R_{source} + F_{CL} \tan(\theta_{source})$) (further details see below "Ray transfer matrix analysis"), and λ—wavelength.

Furthermore, in the case of laser illumination, the size and the divergence of the extended light source 111 can be controlled by displacing the rotating diffuser, changing the focal length of the focusing lens and its position, respectively. Changing the position of the focusing lens also affects the size of the beam hitting the rotating diffuser, so this can also be used to change the size of the extended light source.

The above design equations can be used for designing the components for implementing the inventive Koehler integrator device 120 to multi-focal confocal systems.

Ray Transfer Matrix Analysis

For designing the inventive Koehler integrator device, it is advantageous to perform a ray transfer matrix calculation for the whole Koehler integrator device. In particular, the ray transfer matrix analysis can be used for determining how the size of the excitation spots depends on the properties of the extended light source.

To fully explore the effect of introducing the beam sizing optic (see FIG. 3) between the collimating lens and the first micro-lens array, the two cases are compared side-by-side. For this, the system is divide into three parts $(y_1, \beta_1) \rightarrow (y_2, \beta_2)$, $(x_1, \alpha_1) \rightarrow (x_2, \alpha_2)$, and $(z_1, \gamma_1) \rightarrow (z_2, \gamma_2)$ (see FIGS. 1, 3):

(1) The sub-system 1 $(y_1, \beta_1) \rightarrow (y_2, R_2)$ starts at the light source 111 and ends in a plane containing the first micro-lens array 12, but without considering its effect. $y_2$ effectively determines the radius of the beam incident on the first micro-lens array 12 (R).

Without the Beam Sizing Optic:

$$\begin{pmatrix} y_2 \\ \beta_2 \end{pmatrix} = \begin{pmatrix} \left(1 - \frac{L}{F_{CL}}\right) y_1 + F_{CL} \beta_1 \\ -\frac{y_1}{F_{CL}} \end{pmatrix}$$

Where L is the variable distance between the collimating lens and the first micro-lens array. With the beam sizing optic 16:

$$\begin{pmatrix} y_2 \\ \beta_2 \end{pmatrix} = \begin{pmatrix} \frac{1}{F_{CL} \cdot F_1 \cdot f_2} (F_2^2 (L_1 - F_{CL} - F_1) + F_1^2 (L_2 - F_2)) y_1 - \frac{F_2}{F_1} F_{CL} \beta_1 \\ \frac{F_1}{F_{CL}} \frac{y_1}{F_{CL}} \end{pmatrix}$$

Where $L_1$ and $L_2$ are the distances between the collimating lens 11 and the first lens 16.1 of the beam sizing optic 16, and the distance between the second lens 16.2 of the beam sizing optic 16 and the first micro-lens array 12.

(2) The sub-system 2 $(x_1, \alpha_1) \rightarrow (x_2, \alpha_2)$ starts in local coordinate system of a single micro-lens 12A of the first micro-lens array 12 and ends in the focal plane of the Fourier lens 14, containing the third micro-lens array, but without considering its effect $$\begin{pmatrix} x_2 \\ \alpha_2 \end{pmatrix} = \begin{pmatrix} -\frac{F_{FL}}{f} x_1 \\ -\frac{1}{F_{FL}} (\alpha_1 f - np) \end{pmatrix}$$

(Not explicitly modified by introduction of beam sizing optic.)

(3) The sub-system 3: $(z_1, \gamma_1) \rightarrow (z_2, \gamma_2)$ starts in local coordinate system of a single micro-lens 15A of the third micro-lens array 15 and ends in local focal plane of a single micro-lens 15A of the third micro-lens array 15

$$\begin{pmatrix} z_2 \\ \gamma_2 \end{pmatrix} = \begin{pmatrix} f_x \gamma_1 \\ \gamma_1 - \dfrac{z_1}{f_x} \end{pmatrix}$$

(Not explicitly modified by introduction of beam expander.)

These three subsystems are linked together by boundary conditions that transition from the local coordinate systems of micro-lens arrays 12, 15 to the global coordinate system. The boundary conditions are:

Boundary condition $(y_2, \beta_2) \rightarrow (x_1, \alpha_1)$: from global coordinate system to the local coordinate system of the flat-fielding micro-lens arrays $$\begin{pmatrix} x_1 \\ \alpha_1 \end{pmatrix} = \begin{pmatrix} y_2 - np \\ \beta_2 \end{pmatrix}$$

Boundary condition $(x_2, \alpha_2) \rightarrow (z_1, \gamma_1)$: from global coordinate system to the local coordinate system of the excitation micro-lens array $$\begin{pmatrix} z_1 \\ \gamma_1 \end{pmatrix} = \begin{pmatrix} x_2 - mp_x \\ \alpha_2 \end{pmatrix}$$

Regardless of the elements before the first micro-lens array 12, the ray-tracing matrix between the first micro-lens array 12 and the focal plane of the third micro-lens array is given by (adapted from [6]):

$$\begin{pmatrix} z_2 \\ \gamma_2 \end{pmatrix} = \begin{pmatrix} -\dfrac{f_x}{F_{FL}}(\beta_2 f - np) \\ \dfrac{F_{FL}}{f_x \cdot f} y_2 - \dfrac{f}{F_{FL}} \beta_2 \left( \dfrac{1}{F_{FL}} - \dfrac{F_{FL}}{f \cdot f_x} \right) np + \dfrac{mp_x}{f_x} \end{pmatrix} \cong$$

$$\begin{pmatrix} -\dfrac{f_x}{F_{FL}}(\beta_2 f - y_2) \\ -\dfrac{f}{F_{FL}} \beta_2 + \dfrac{1}{F_{FL}} y_2 + \dfrac{mp_x}{f_x} \end{pmatrix}$$

Where np indicates the radius of the beam incident on the first micro-lens array 12, equally corresponding to the maximal height of a beam incident on the array 12, $R=\max(y_2)$. Similarly, the maximal values of $y_1$, $\beta_1$ are set by the radius and angular divergence of the extended light source 111:

$$\max(y_1) = R_{source}$$

$$\max(\beta_1) = \theta_{source}$$

By replacing the values of $y_2$ and $\beta_2$ into the system with or without a beam sizing optic, it can be shown that the overall size of the excitation spots can be minimized more effectively in the case including the beam sizing optic 16. To find the size of the excitation spot r, compute the maximum of $z_2$, $r=\max(z_2)$ is computed:

Without Beam Expander $$r \cong \dfrac{f_x}{F_{FL}} \left( 1 - \dfrac{L}{F_{CL}} + \dfrac{f}{F_{CL}} \right) R_{source} + \dfrac{f \cdot F_{CL}}{F_{FL}} \theta_{source}$$

Where L is the distance between the collimating lens and the first flat-fielding micro-lens array.

A few interesting solutions can be identified, which facilitate the contraction of the beam sizing optic, but are not obligatory:

If $L=F_{CL}$, the beam height: $y_2 = F_{CL} \beta_1$ is set purely by divergence of extended source, the beam radius: $R = F_{CL} \theta_{source}$ is set purely by divergence of extended light source, and the spot size is about $$r \cong \dfrac{f_x \cdot f}{F_{FL} \cdot F_{CL}} R_{source} + \dfrac{f \cdot F_{CL}}{F_{FL}} \theta_{source}$$

If $L=F_{CL}-f$, the beam height is $$y_2 = \dfrac{f}{F_{CL}} y_1 + F_{CL} \beta_1,$$

the beam radius is $$R = \dfrac{f}{F_{CL}} R_{source} + F_{CL} \theta_{source},$$

and the spot size $$r \cong \dfrac{f \cdot F_{CL}}{F_{FL}} \theta_{source}$$

is set purely by divergence of extended source.

With beam sizing optic $$r \cong \dfrac{f_x}{F_{FL} \cdot F_{CL}} \left( \dfrac{F_2}{F_1}(L_1 - F_{CL} - F_1) + \dfrac{F_1}{F_2}(L_2 - F_2) - \dfrac{f \cdot F_1}{F_2} \right) R_{source} + \dfrac{f \cdot F_{CL} \cdot F_2}{F_{FL} \cdot F_1} \theta_{source}$$

Where $L_1$ is the distance between the collimating lens 11 and the first beam expander lens 16.1, and $L_2$ the distance between the second beam expander lens 16.2 and the first micro-lens array 12. Since the second term of the expression for r dominates, it can be seen that introducing a beam sizing optic rescales the size of the excitation foci by a factor of $F\_2/F\_1$. In the case where $F\_2<F\_1$, this leads to a decrease in size. Optional modification of $L_1$ and $L_2$ allows a flexible tuning of the radius R.

A couple of interesting solutions can be identified which facilitate the contraction by the beam sizing optic 16, but are not obligatory:

If $L_1=F_1+F_{CL}$ and $L_2=F_2$, the beam height $$y_2 = -\dfrac{F_2}{F_1} F_{CL} \theta_1$$

is set purely by divergence of extended source, the beam radius:

$$R^* = -\frac{F_2}{F_1} F_{CL} \theta_{source}$$

is set purely by divergence of extended source, and the spot size is $$r = \frac{f_x \cdot F_1 \cdot f}{F_{FL} \cdot F_{CL} \cdot F_2} R_{source} + \frac{f \cdot F_{CL} \cdot F_2}{F_{FL} \cdot F_1} \theta_{source}.$$

If $L_1=F_1$ and $L_2=F_2$, the beam height is $$y_2 = -\frac{F_2}{F_1}(y_1 + F_{CL}\beta_1),$$

the beam radius is $$R^* = -\frac{F_2}{F_1}(R_{source} + F_{CL}\theta_{source}),$$

and the spot size is $$r = \frac{f_x}{F_{FL} \cdot F_{CL}} \left(-\frac{F_2}{F_1} F_{CL} + \frac{f \cdot F_1}{F_2}\right) R_{source} + \frac{f \cdot F_{CL} \cdot F_2}{F_{FL} \cdot F_1} \theta_{source}.$$

If $$L_2 = \frac{F_2}{F_1}(F_1 + F_2),$$

the beam height $$y_2 = -\frac{F_2}{F_1}\left(1 - \frac{L_1}{F_{CL}}\right)y_1 - \frac{F_2}{F_1} F_{CL}\beta_1$$

provides direct rescaling between cases with and without a beam expander, beam radius $$R^* = -\frac{F_2}{F_1}\left(1 - \frac{L_1}{F_{CL}}\right)R_{source} - \frac{F_2}{F_1} F_{CL}\theta_{source}$$

provides direct rescaling between cases with and without a beam expander, and spot size is $$r = \frac{f_x \cdot F_2}{F_{CL} \cdot F_{FL} \cdot F_1}\left(1 - \frac{L_1}{F_{CL}}\right)R_{source} + \frac{f \cdot F_{CL} \cdot F_2}{F_{FL} \cdot F_1} \theta_{source}$$

The features of the invention disclosed in the above description, the drawings and the claims can be of significance individually, in combination or sub-combination for the implementation of the invention in its different embodiments.

The invention claimed is:

1. A Koehler integrator device, comprising
a collimating lens being arranged for collimating a light field created by a light source device to provide a collimated light field,
a pair of planar first and second micro-lens arrays, being arranged for relaying portions of the collimated light field along separate imaging channels, wherein all micro-lenses of the first and second micro-lens arrays have an equal micro-lens focal length and pitch and the micro-lens arrays are arranged with a mutual distance equal to the micro-lens focal length,
a collecting Fourier lens having a Fourier lens diameter and a Fourier lens focal length defining a Fourier lens front focal plane and a Fourier lens back focal plane, wherein the Fourier lens is arranged for superimposing light from all imaging channels in the Fourier lens front focal plane and wherein the second micro-lens array is arranged in the Fourier lens back focal plane, and
a third micro-lens array being arranged in the Fourier lens front focal plane for creating a wavelength independent array of illumination spots.

2. The Koehler integrator device according to claim 1, wherein
the third micro-lens array has a pitch in a range from 50 μm to 1500 μm.

3. The Koehler integrator device according to claim 1, wherein
the third micro-lens array comprises at least 5*5 micro-lenses.

4. The Koehler integrator device according to claim 1, wherein
the third micro-lens array is fixed.

5. The Koehler integrator device according to claim 1, wherein
the third micro-lens array is scannable.

6. The Koehler integrator device according to claim 1, wherein
each of the first and second micro-lens arrays have a common a pitch in a range from 50 μm to 1500 μm.

7. The Koehler integrator device according to claim 1, wherein
each of the first and second micro-lens arrays comprises at least 5*5 micro-lenses.

8. The Koehler integrator device according to claim 1, further comprising
a beam sizing optic being arranged between the collimating lens and the first micro-lens array for changing a diameter of the collimated light field.

9. The Koehler integrator device according to claim 8, wherein
the beam sizing optic is arranged for contracting the diameter of the collimated light field and comprises a first beam de-expander lens having a first beam de-expander lens focal length and a second beam de-expander lens having a second beam de-expander lens focal length, which is smaller than the first beam de-expander lens focal length.

10. The Koehler integrator device according to claim 8, wherein
the beam sizing optic comprises a variable beam expander.

11. The Koehler integrator device according to claim 8, wherein
the beam sizing optic is arranged for expanding the diameter of the collimated light field and comprises a first beam expander lens having a first beam expander lens focal length and a second beam expander lens having a second beam expander lens focal length, which is larger than the first beam expander lens focal length.

12. The Koehler integrator device according to claim 8, wherein
the beam sizing optic is adjustable for controlling the diameter of the collimated light field.

13. The Koehler integrator device according to claim 1, further comprising
a hard aperture being arranged between the collimating lens and the first micro-lens array for limiting a diameter of the collimated light field.

14. The Koehler integrator device according to claim 13, wherein
the hard aperture comprises an iris diaphragm.

15. The Koehler integrator device according to claim 1, further comprising
a pinhole array being arranged in a front focal plane of the third micro-lens array for limiting a diameter of the illumination spots.

16. A method of using a Koehler integrator device according to claim 1, said method comprising creating a pattern of illumination spots in a multi-focal confocal microscope.

17. A confocal microscope apparatus, being arranged for multi-focal sample illumination, comprising
a light source device being arranged for creating an excitation light field,
a Koehler integrator device according to claim 1, being arranged for creating the array of illumination spots,
a scanning device being arranged for creating a scanning pattern of the illumination spots,
a focusing optic for focusing the scanning pattern of the illumination spots to a sample to be imaged, and
a detector device being arranged for detecting a pattern of emission spots excited by the pattern of illumination spots.

18. The confocal microscope apparatus according to claim 17, wherein
the light source device comprises a coherent light source, and
a focusing lens and a light scrambling device are arranged between the coherent light source and the collimating lens of the Koehler integrator device.

19. The confocal microscope apparatus according to claim 18, wherein
the focusing lens and the collimating lens provide an imaging optic including the light scrambling device.

20. The confocal microscope apparatus according to claim 17, wherein
the light source device comprises an incoherent light source.

21. The confocal microscope apparatus according to claim 17, further comprising
a pinhole array being arranged in a front focal plane of the third micro-lens array for limiting a diameter of the generated illumination spots.

22. A method of using a confocal microscope apparatus according to claim 17, said method comprising imaging a sample to be investigated.

23. The method according to claim 22, wherein the Koehler integrator device includes a beam sizing optic arranged between the collimating lens and the first micro-lens array for changing a diameter of the collimated light field, wherein the beam sizing optic is arranged for contracting the diameter of the collimated light field and comprises a first beam de-expander lens having a first beam de-expander lens focal length and a second beam de-expander lens having a second beam de-expander lens focal length, which is smaller than the first beam de-expander lens focal length, and the method comprises the step of controlling the diameter of the collimated excitation light field by adjusting the beam sizing optic such that both of a homogeneity of the illumination and a spot size of the illumination spots are sufficient for the imaging of the sample to be investigated.

24. The method according to claim 22, wherein the Koehler integrator device includes a hard aperture arranged between the collimating lens and the first micro-lens array for limiting a diameter of the collimated light field, wherein the hard aperture comprises an iris diaphragm with a variable diameter and the method comprises the step of controlling the diameter of the collimated excitation light field by changing a size of the iris diaphragm.

* * * * *